(12) United States Patent
Pinks

(10) Patent No.: US 7,107,026 B2
(45) Date of Patent: Sep. 12, 2006

(54) AUTOMATIC MATCHING AND TUNING UNIT

(75) Inventor: John R. Pinks, Seabright (CA)

(73) Assignee: Nautel Limited, Hackett's Cove (CA)

( * ) Notice: Subject to any disclaimer, the term of this patent is extended or adjusted under 35 U.S.C. 154(b) by 391 days.

(21) Appl. No.: 10/776,220

(22) Filed: Feb. 12, 2004

(65) Prior Publication Data

US 2005/0181750 A1 Aug. 18, 2005

(51) Int. Cl.
*H01Q 11/12* (2006.01)
*H04B 1/04* (2006.01)

(52) U.S. Cl. ............ 455/123; 455/125; 333/17.3; 343/860

(58) Field of Classification Search ............ 455/123, 455/120, 121, 124, 125; 343/850, 860–864; 333/17.3, 32, 124, 177, 202
See application file for complete search history.

(56) References Cited

U.S. PATENT DOCUMENTS

| | | | | |
|---|---|---|---|---|
| 2,981,902 A | * | 4/1961 | Familier | 333/17.1 |
| 3,355,667 A | * | 11/1967 | Bruene | 455/123 |
| 3,775,707 A | * | 11/1973 | Frazier | 333/32 |
| 3,919,644 A | * | 11/1975 | Smolka | 455/123 |
| 4,112,395 A | * | 9/1978 | Seward | 333/17.3 |
| 4,689,803 A | * | 8/1987 | Johannessen et al. | 375/304 |
| 5,631,611 A | | 5/1997 | Luu | |
| 5,889,252 A | * | 3/1999 | Williams et al. | 219/121.54 |
| 6,992,543 B1 | * | 1/2006 | Luetzelschwab et al. | 333/32 |

* cited by examiner

*Primary Examiner*—Edward F. Urban
*Assistant Examiner*—Blane J. Jackson
(74) *Attorney, Agent, or Firm*—McDermott Will & Emery LLP

(57) ABSTRACT

An automatic matching and tuning unit (AMTU), which connects the output from a low or medium frequency, high power radio transmitter, which requires a 50 ohm terminating impedance, to an antenna with an input impedance comprising low resistance in series with a high capacitive reactance. Sensors measure the phase angle between the input current and voltage. The inductance of a series connected loading coil is continuously varied to resonate the antenna capacitance. The resulting input resistance is transformed to 50 ohms using a matching transformer and pair of resonant, mutually coupled coils with adjustable mutual coupling. Sensors measure the input resistance and continuously adjust the mutual coupling coefficient to maintain the required 50 ohm input impedance. Sensors measure the antenna current and vary the transmitter power level to keep it constant. A microcontroller processes all of the sensor outputs and provides serial communication with the transmitter.

26 Claims, 3 Drawing Sheets

AUTOMATIC MATCHING AND TUNING UNIT

BACKGROUND OF THE INVENTION

The present invention relates to a matching and tuning unit (AMTU), which connects the output from a low or medium frequency high power radio transmitter to an antenna with a complex input impedance.

Most state-of-the-art high power radio transmitters which operate in the low or medium frequency bands unitize class D switching amplifiers which are much more efficient than their predecessors which operated as Class B amplifiers. This very significant improvement in efficiency has greatly reduced the size of the modem equipment, because large cooling surfaces are no longer required. As a result, these transmitters are much more susceptible than their predecessors to the effects of mismatch at their output terminals which results in reflected power being dissipated in the heat sinks of their final amplifiers. The task of establishing and maintaining an acceptable matched condition between transmitters and antennas, which operate in the low and medium frequency bands presents a uniquely difficult situation. This is due to the fact that the physical height of these antennas is typically much lower than an optimum value. This deficiency in physical height results in an antenna input impedance that is equivalent to a low value resistance in series with a high capacitive reactance. The purpose of the AMTU is to transform this complex input impedance to the purely resistive 50 ohm value required to terminate the transmitter and to compensate for weather related changes in both the capacitive reactance and the resistance of the antenna so that the transmitter remains perfectly matched at all times.

The AMTU resonates the antenna's reactance with a series connected adjustable loading coil. Sensors measure the phase angle between the voltage and the current at the input of the AMTU. A microcontroller controlled motor adjusts the inductance of the loading coil to maintain this phase angle at zero degrees.

The value of the input resistance of the AMTU is transformed to the required 50 ohm value by the combination of a ferrite cored transformer with fixed tapping positions together with a pair of tuned, air cored, mutually coupled coils. Sensors are used to measure the value of the resistance at the input to the AMTU. A microcontroller-controlled motor adjusts the value of the coupling coefficient between the mutually coupled coils to maintain an input resistance value of 50 ohms.

In addition, the antenna current is monitored and feedback to the associated transmitter is used to maintain it at a constant value.

A sensor measures the value of the radio frequency current applied to the antenna. An RS485 serial link between the microcontroller in the AMTU and a microcontroller in the associated transmitter adjusts the output power level from the transmitter in order to maintain a constant antenna current when weather related changes to the loss resistance components of the antenna's input resistance occur.

The use of "TEE" or "PI" networks to implement the necessary impedance transformation, in which inductance and capacitor values are varied to obtain a matched condition is well known in the art. These networks suffer from the drawback that the component values are inter-dependent. A change in the value of any component affects both the resistance and the phase angle of the input impedance making automatic adjustment difficult. With the present invention the component changes to correct for reactive and resistive variations are independent, making automatic tuning and matching easier to implement.

U.S. Pat. No. 5,631,611, uses a similar technique to that embodied in the present invention in that tuned, mutually coupled coils are used to adjust the resistive component of the input impedance. However U.S. Pat. No. 5,631,611 requires a large, very expensive, high power variable vacuum capacitor to tune the secondary winding of the coupled coils. In the present invention, this variable capacitor is not required. A tuned condition in the secondary circuit of the mutually coupled coils is achieved by automatic adjustment of the loading coil inductance. The present invention also improves upon U.S. Pat. No. 5,631,611 with the addition of a feedback loop to maintain the antenna current at a constant value.

The present invention also provides an ability to monitor, control and test the AMTU from the location of the transmitter. The transmitter is typical positioned at a safe distance from the near field of the antenna where high electric and magnetic fields can be dangerous to the health of maintenance personnel. This same monitor and control feature may also be made from any location via the Internet.

SUMMARY OF THE INVENTION

According to a first aspect of the present invention, there is provided a matching and tuning network for connecting a source of RF power to a complex load, the network comprising a primary circuit, a secondary circuit and a tertiary circuit; the primary circuit comprising an adjustable tuning capacitor connected in series with a primary winding of a pair of mutually coupled coils connected to the source of RF power; the secondary circuit comprising a series connection of a secondary winding of the pair of mutually coupled coils and a fixed capacitor connected to an input of a transformer; the tertiary circuit comprising a connection of an output of the transformer and an input of a tapped loading coil connected to the load; the matching and tuning network further comprising: input voltage sensing means; input current sensing means; impedance detector means connected to both the input voltage sensing means and the input current sensing means; a phase detector means; and antenna current sensing means; wherein the impedance detector means controls means for varying the coupling between the primary winding and the secondary winding of the pair of mutually coupled coils, the phase detector means controls means for varying the inductance of the tapped loading coil so as to maintain a constant input impedance and a zero phase angle between the current and voltage at the input to the network and the antenna current sensing means controls means for varying the output power level of the source of RF power.

According to a second aspect of the present invention, there is provided a control circuit for controlling a matching and tuning network according to the first aspect of the present invention, the control circuit comprising: a first and a second microcontroller connected by a serial link; a first control signal representative of the input voltage of the matching and tuning network by the voltage detector means and input to the first microcontroller; a second control signal representative of the input current of the matching and tuning network by the input current detector means and input to the first microcontroller; a third control signal representative of a situation where the voltage leads the current at the input of the matching and tuning network and input to the first microcontroller; a fourth control signal representative of a situation where the voltage lags the current at the input of the matching and tuning network and input to the first microcontroller; and a fifth control signal representative of the antenna current output by the antenna current detector means and input to the first microcontroller and passed to the second microcontroller via the serial link, wherein: the first microcontroller receives and compares the first and second control signals and generates a sixth control signal to control the means for varying the coupling between the primary and secondary winding of the pair of mutually coupled coils; the first microcontroller receives the third and fourth control signals and generates a seventh control signal to control means for varying the inductance of the tapped loading coil; and the second microcontroller generates an eighth control signal to control the output power level of the source of RF power.

BRIEF DESCRIPTION OF THE DRAWINGS

The present invention will now be described in detail with reference to the accompanying drawings, in which.

DETAILED DESCRIPTION OF THE INVENTION

Figure 2:
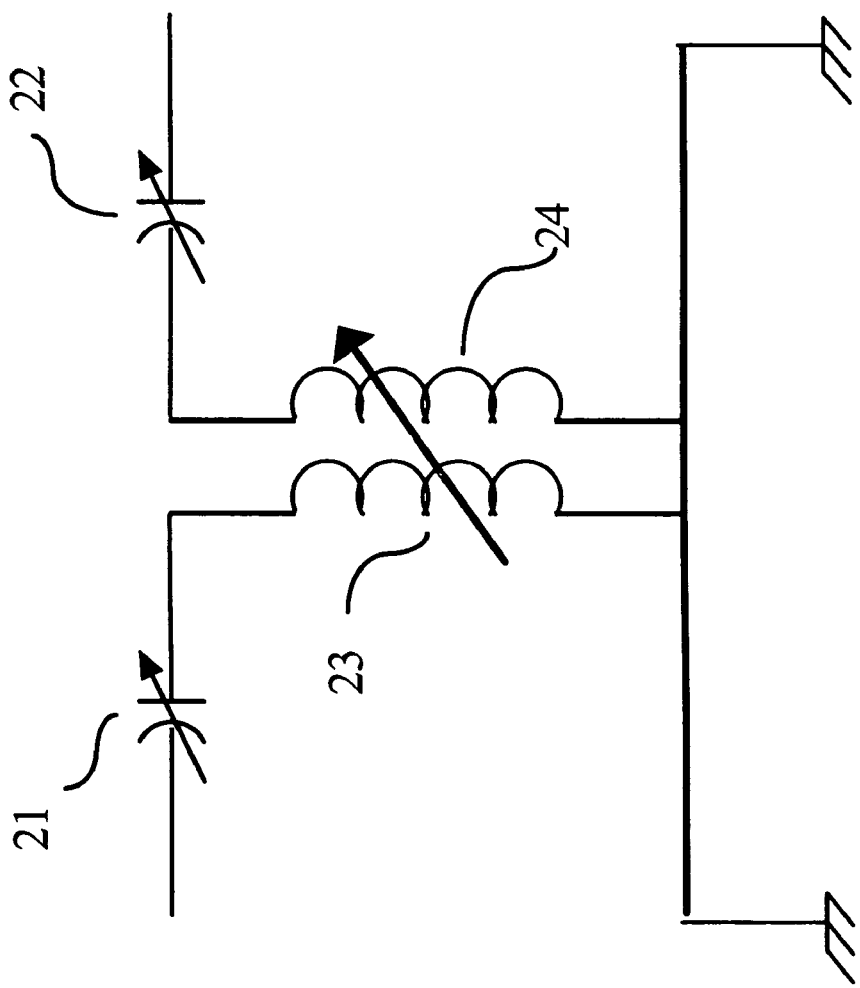
FIG. 2 is a circuit diagram showing the tuned, mutually coupled coils of the embodiment of FIG. 1.

The present invention utilizes two tuned, mutually coupled coils, between which the coupling factor k can be varied. FIG. 2 shows the circuit diagram of this arrangement. The inductances of the primary 23 and the secondary 24 windings of the mutually coupled coils are equal and are tuned for series resonance at the operating carrier frequency by equal capacitors 21 and 22.

Capacitors 21 and 22 are tuned to resonate with the equal fixed inductance values of the primary 23 and the secondary 24 windings of the mutually coupled coils hence their reactances are numerically equal to $X_L$ (i.e. $\omega L = 1/\omega C$).

Figure 3:
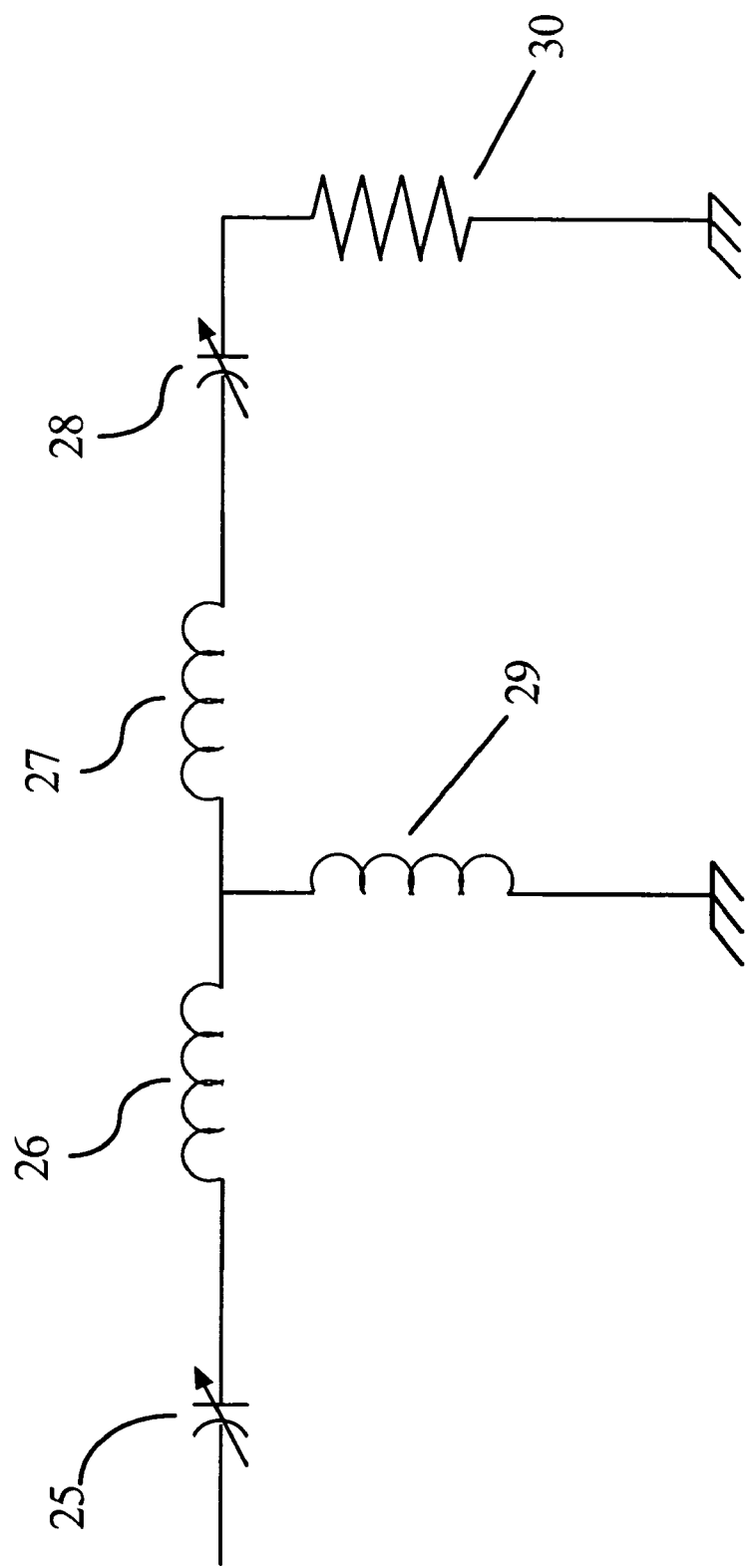
FIG. 3 is a circuit diagram of the equivalent circuit to the circuitry of FIG. 2.

FIG. 3 shows the equivalent circuit of this arrangement shown in FIG. 2. An analysis of the equivalent circuit as shown in FIG. 3 proceeds as follows:

Capacitors 25 and 28 have equal impedance values, of $-j\omega L$ (since $|X_L|=|X_C|$);

Inductors 26 and 27 have equal impedance values, $j\omega(L-M)$;

Inductor 29 has an impedance value of $j\omega M$; and

Resistor 30 has an impedance value of $R_L$.

where, $j$ = square root of $-1$, $\omega$ = angular velocity of the input frequency in radians per second, $C$ = capacitor value in Farads of both capacitors 21 and 22, $L$ = inductance value in Henries of both inductors 23 and 24, $M$ = mutal inductance between inductors 23 and 24, $R_L$ = resistance connected to the output terminals, and $M = k *$ square root of $(L_P * L_S)$ $= kL$ (since $L_P = L_S$)

where k=coupling coefficient between inductors 23 and 24.

Analysis of this circuit yields an input impedance $Z_{in}=k^2 * (\omega L)^2/R_L$.

This formula shows that providing the terminating resistance $R_L$ is purely resistive, the input impedance $Z_{in}$ is also purely resistive and is proportional to the square of the coupling coefficient k. Hence, providing L remains constant, variation of the value of k can be used to vary the value of the input resistance without a related change in its phase angle.

Figure 1:
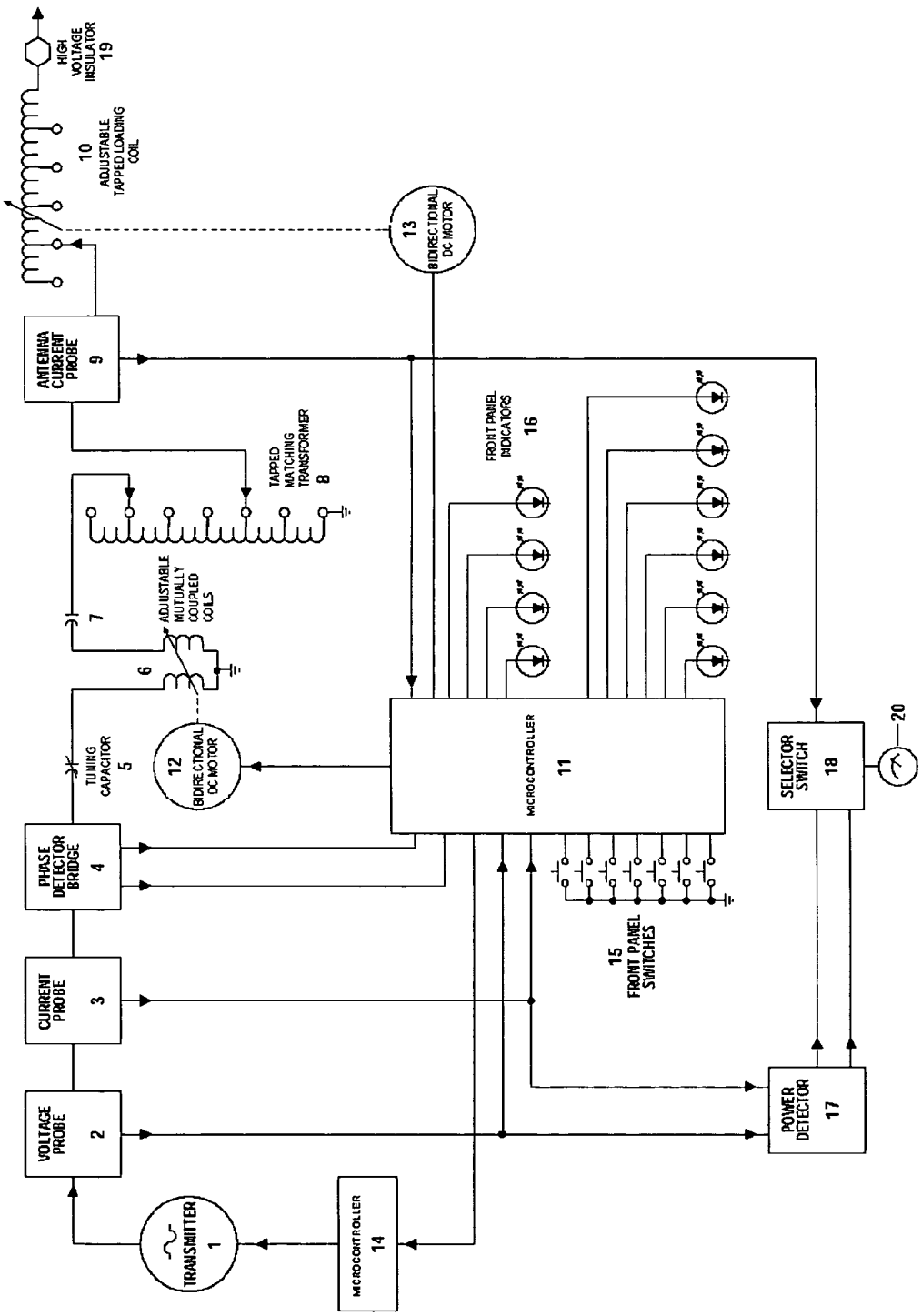
FIG. 1 is a schematic block diagram of the matching network according to an embodiment the present invention.

FIG. 1 shows a schematic block diagram of the Automatic Matching and Tuning Unit. The transmitter (1) is connected via a radio frequency coaxial cable with a 50 ohm characteristic impedance to the input of the AMTU. The cable must be terminated by a resistive, 50 ohm load to ensure maximum power transfer and minimum reflected power. The transmitter has an output power level that may be adjusted by both local front panel controls and an external remote power trim control.

Input voltage sensing means 2 and input current sensing means 3 sample the high power input signal and generate dc voltages proportional, respectively, to the rf input voltage and rf input current. When the input impedance is equal to 50 ohms, these dc voltages are of equal magnitude.

Phase detector means 4 measures the phase angle between the rf input voltage and rf input current. The detector has two output lines. If the phase angle is zero no output signal is generated. If the voltage leads the current, a positive voltage is generated at one of its two outputs. If the voltage lags the current, a positive voltage is generated at its other output.

The RF power signal is passed via the means 1, 2 and 3 to variable tuning capacitor 5. This variable tuning capacitor comprises an array of six fixed, high power rf capacitors which are selectively connected in parallel during initial installation to resonate with the inductance of the primary winding of mutually coupled coils 6. The values of the six capacitors are chosen as a binary sequence (each capacitor has a value of twice the value of the previous capacitor in the sequence) providing 64 different combinations to cover the required operating range from 190 kHz to 535 kHz.

The adjustable mutually coupled coils 6, comprise two similar coils wound on cylindrical formers. The primary winding is mounted in a fixed position. The secondary winding has an outer diameter that is slightly smaller than the inner diameter of the primary winding, such that it can be moved inside the primary on the same axis. It has more turns spaced slightly closer together such that the coils have equal inductances and equal physical lengths. The position of the secondary winding is controlled by a lead screw, that is driven by a first bidirectional motor 12. The range of variation of the coupling coefficient k is from a value of 0.75 when fully inserted to a value of 0.3 when partially withdrawn. As the input impedance is proportional to $k^2$, it can be seen that an overall variation of $(0.75/0.3)^2=6.25:1$ is achieved.

The secondary winding of mutually coupled coils 6 is connected via a single high power rf capacitor 7 that is approximately resonant with its inductance at the center of the operating frequency band, to the input of ferrite cored transformer 8. This rf autotransformer has fixed tapping positions which are set up during initial installation to present a desired impedance value at the secondary winding of the coupled coils. This transformer also provides a dc path to ground for the antenna, such that static voltage generation within the antenna is eliminated.

Antenna current sensing means 9 samples the rf current that is applied to the input of the loading coil. It produces a dc voltage that is proportional the mean value of the antenna current.

The components of the AMTU are housed in an aluminum cabinet to contain the magnetic field of the loading coils. This is necessary to prevent external conditions from affecting the inductance of the loading coils and to prevent their strong magnetic field from causing undesirable external effects. The loading coil 10 comprises a pair of coils wound on cylindrical formers that are mounted side by side. The coils are wound in opposite directions (one in a clockwise direction and the other in a counterclockwise direction). This causes their combined magnetic flux to follow a tightly controlled path that is much more contained than that which is obtained with a single solenoid. This enables the size of the aluminum cabinet of the AMTU to be reduced, without introducing excessive eddy current losses. The coils contain multiple fixed tapping positions, which are selected during initial installation to resonate with the capacitance of the antenna. The coils may be connected either in series or in parallel, providing a wide selection of their combined inductance value. For system power levels of less than 125 watts, ferrite slug assemblies are coaxially moved in or out to provide an inductance variation. With system power levels above 125 watts and up to 3000 watts, a cylindrical copper slug is inserted into one of the coils to obtain the required inductance variation. In either case, the tuning function is actuated by a lead screw driven by a second bidirectional dc motor 13. The loading coil 10 is connected to the load in series through a high voltage insulator 19.

The dc voltages representing voltage and current produced by means 2 and 3 are compared by microcontroller 11. If they are equal, the microcontroller 11 turns on a match normal indicator. If the dc voltage representing the rf voltage is greater that the dc voltage representing the rf current, the microcontroller turns off the match normal indicator and turns on a match high indicator. The microcontroller 11 also produces a signal causing the bi-directional motor 12 to reduce the coupling coefficient between the mutually coupled coils 6. When the voltages representing voltage and current are equalized the match high indicator is turned off and the match normal indicator is turned on. If the dc voltage representing current is greater, indicating that the input resistance is less than 50 ohms, the microcontroller 11 turns off the match normal indicator and turns on a match low indicator. It also generates a signal to operate the bi-directional motor 12 to increase the coupling coefficient between the mutually coupled coils 6. When a correctly matched condition is re-established the microcontroller turns off the match low indicator and turns on the match normal indicator.

The two output lines from phase detector means 4 are fed to microcontroller 11. If a positive voltage exists on either output line, the microcontroller 11 turns on the appropriate tune high or tune low indicator. The microcontroller 11 then controls the bi-directional DC motor 13 to adjust the inductance of the tapped loading coils 10 to reduce the phase angle to zero. When a tuned condition is re-established, the tune high/low indicator is turned off and a tune normal indicator is turned on.

Seven momentary action, front panel switches are used to control the operation of microcontroller 11. LOC/REM switch toggles functional control between local and remote locations.

When the REM condition is initiated by a momentary closure of the front panel LOC/REM, a LOC indicator is turned off, a REM indicator is turned on and serial data from the microcontroller 14 located in the transmitter 1 is used to control the following functions.

Inhibit Tune

When this condition is initiated an inhibit tune indicator turns on and the microcontroller 11 is inhibited from activating the motor 13.

Inhibit Match

When this condition is initiated an inhibit match indicator turns on and microcontroller 11 is inhibited from activating the motor 12.

Slew Tune High

When this condition is initiated, the signals from the phase detector means 4 are ignored and the microcontroller 11 controls the motor 13 to move in the direction to increase the inductance of the loading coil 10.

Slew Tune Low

When this condition is initiated, the signals from the phase detector means 4 are ignored and the microcontroller 11 controls the motor 13 to move in the direction to decrease the inductance of the loading coil 10.

Slew Match High

When this condition is initiated the signals from the input voltage sensing means 2 and the input current sensing means 3 are ignored and the microcontroller 11 controls the motor 13 to move in the direction to increase the coupling coefficient of the mutually coupled coils 6 thus increasing the input resistance.

Slew Match Low

When this condition is initiated the signals for the input voltage sensing means 2 and the input current sensing means 3 are ignored and the microcontroller 11 controls the motor 13 to move in the direction to reduce the coupling coefficient of the mutually coupled coils 6 thus reducing the input resistance.

When the LOC control is initiated by a momentary closure of the front panel LOC/REM switch, a REM indicator is turned off and the LOC indicator is turned on. Serial data from microcontroller 14 is ignored and the remaining six momentary action switches are activated to control their respective functions. Momentary closure of these six switches toggles their respective control function on or off and where appropriate turns on the inhibit tune or inhibit match indicators. Following an interruption of the system power supply, microcontroller 11 is designed to return to the state that existed at initiation of the interruption.

The dc voltage representing the mean value of the Antenna Current produced by antenna current sensing means 9 is fed via microcontroller 11 and an RS485 serial link to microcontroller 14. Microcontroller 14 controls the output power level of the transmitter 1 to maintain the antenna current at the level that was set up during the initial installation.

The dc voltages representing the level of the RF Voltage and RF Current from input voltage sensing means 2 and input current sensing means 3 are fed to a power detector 17. This power detector adds the two signals together to determine the forward power and subtracts the two signals to determine the reflected power for display on a front panel meter 20 as selected by selector switch 18. The required multiplication function is provided by use of a square law scale on the meter. This meter can also be switched by selector switch 18 to display the antenna current on a second, linear scale.

I claim:

1. A matching and tuning network for connecting a source of RF power to a complex load, the network comprising:
   a primary circuit comprising an adjustable tuning capacitor connected in series with a primary winding of a pair of mutually coupled coils adapted to connect to a source of RF power;
   a secondary circuit comprising a series connection of a secondary winding of said pair of mutually coupled coils and a fixed capacitor connected to an input of a transformer; and
   a tertiary circuit comprising a connection of an output of the transformer and an input of a tapped loading coil connected to said load;
   the matching and tuning network further comprises:
   input voltage sensing means;
   input current sensing means;
   impedance detector means connected to both said input voltage sensing means and said input current sensing means;
   a phase detector means; and
   antenna current sensing means;
   wherein the impedance detector means controls means for varying the coupling between said primary winding and said secondary winding of said pair of mutually coupled coils, said phase detector means controls means for varying the inductance of the tapped loading coil so as to maintain a constant input impedance and a zero phase angle at the input to the network and said antenna current sensing means controls means for varying the output power level of the source of RF power.

2. The matching and tuning network according to claim 1, wherein the tapped loading coil comprises a pair of cylindrically oppositely wound coils mounted side by side.

3. The matching and tuning network according to claim 2, wherein the pair of cylindrically oppositely wound coils have a plurality of fixed tapping positions, wherein a position on each of said cylindrically oppositely wound coils is selected and are connected so as to resonate the capacitance of the complex load.

4. The matching and tuning network according to claim 3, wherein said pair of cylindrically oppositely wound coils are connected in parallel or in series, providing a wide selection of capacitance values.

5. The matching and tuning network according to claim 1, wherein the impedance detector is connected to a first bi-directional motor to vary the coupling of the pair of mutually coupled coils.

6. The matching and tuning network according to claim 5, wherein the phase detector is connected to a second bi-directional motor to vary the inductance of said tapped loading coil.

7. The matching and tuning network according to claim 6, wherein the inductance of said tapped loading coil is varied by moving a first metallic slug in or out of one of said cylindrically oppositely wound coils and a second metallic slug in or out of the other one of said cylindrically oppositely wound coils.

8. The matching and tuning network according to claim 7, wherein said first and second metallic slugs is comprised of ferrite.

9. The matching and tuning network according to claim 6, wherein the inductance of said tapped loading coil is varied by moving a metallic slug in or out of one of said cylindrically oppositely wound coils.

10. The matching and tuning network according to claim 9, wherein said metallic slug is comprised of copper.

11. A control circuit for controlling a matching and tuning network according to claim 6, the control circuit comprising:
    a first microcontroller and a second microcontroller electrically connected to one another;
    a first control signal representative of the input voltage of the source of RF power output by said voltage detector means and input to said first microcontroller;
    a second control signal representative of the input current of the source of RF power output by said input current detector means and input to said first microcontroller;
    a third control signal representative of a situation where the input voltage leads the input current of the source of RF power and input to said first microcontroller;
    a fourth control signal representative of a situation where the input voltage lags the input current of the source of RF power and input to said first microcontroller; and
    a fifth control signal representative of the antenna current output by said antenna current detector means and input to said first microcontroller and passed to said second microcontroller via said serial link, wherein:
    said first microcontroller receives and compares said first and said second control signals and generates a sixth control signal to control the means for varying the coupling between said primary winding and said secondary winding of said pair of mutually coupled coils;
    said first microcontroller receives said third and fourth control signals and generates a seventh control signal to control means for varying the inductance of the tapped loading coil; and
    said second microcontroller generates an eighth control signal to control the output power level of said source of RF power.

12. The control circuit according to claim 11, wherein said first microcontroller and said second microcontroller are connected via a serial link.

13. The control circuit according to claim 12, further comprising a plurality of front panel indicators, each connected to said first microcontroller, wherein:
    a first front panel indicator indicates local functional control of said microcontroller;
    a second front panel indicator indicates remote functional control of said microcontroller;
    a third front panel indicator indicates inhibition of activation of said first bi-directional motor;
    a fourth front panel indicator indicates inhibition of activation of said second bi-directional motor;
    a fifth front panel indicator indicates a situation where said first and second control signals are equal;
    a sixth front panel indicator indicates a situation where said first control signal is greater than second control signals;
    a seventh front panel indicator indicates a situation where said first control signal is lower than second control signals;
    an eighth front panel indicator indicates a situation where said third control signal is active;
    a ninth front panel indicator indicates a situation where said fourth control signal is active; and
    a tenth front panel indicator indicates a situation where said third and fourth control signals are inactive.

14. The control circuit according to claim 12, wherein said remote functional control is controlled by said second microcontroller rendering said second to seventh momentary action switches inoperable.

15. The control circuit according to claim 12, wherein said local functional control is controlled by said first microcontroller rendering said second to seventh momentary action switches operable.

16. The control circuit according to claim 12, wherein said remote location is a location shared by said source of RF power.

17. The control circuit according to claim 11, wherein said first microcontroller and said second microcontroller are connected via a network.

18. The control circuit according to claim 17, wherein said remote location is a terminal connected to the Internet.

19. The control circuit according to claim 11, further comprising a plurality of momentary action switches, each connected to said first microcontroller, wherein:
- a first momentary action switches toggles functional control of said first microcontroller between a local and a remote location;
- a second momentary action switches toggles the inhibition of activation of said first bi-directional motor;
- a third momentary action switches toggles the inhibition of activation of said second bi-directional motor;
- a fourth momentary action switches toggles the ignoring of said first and second control signals and instructs said first microcontroller to control said first bi-directional motor in the direction to decrease the coupling between said primary winding and said secondary winding of said pair of mutually coupled coils;
- a fifth momentary action switches toggles the ignoring of said first and second control signals and instructs said first microcontroller to control said first bi-directional motor in the direction to increase the coupling between said primary winding and said secondary winding of said pair of mutually coupled coils coil;
- a sixth momentary action switches toggles the ignoring of said third and fourth control signals and instructs said first microcontroller to control said second bi-directional motor in the direction to decrease the inductance of said tapped loading coil; and
- a seventh momentary action switches toggles the ignoring of said third and fourth control signals and instructs said first microcontroller to control said second bi-directional motor in the direction to increase the inductance of said tapped loading coil.

20. The control circuit according to claim 11, further comprising a plurality of front panel indicators, each connected to said first microcontroller, wherein:
- a first front panel indicator indicates local functional control of said microcontroller;
- a second front panel indicator indicates remote functional control of said microcontroller;
- a third front panel indicator indicates inhibition of activation of said first bi-directional motor;
- a fourth front panel indicator indicates inhibition of activation of said second bi-directional motor;
- a fifth front panel indicator indicates a situation where said first and second control signals are equal;
- a sixth front panel indicator indicates a situation where said first control signal is greater than second control signals;
- a seventh front panel indicator indicates a situation where said first control signal is lower than second control signals;
- an eighth front panel indicator indicates a situation where said third control signal is active;
- a ninth front panel indicator indicates a situation where said fourth control signal is active; and
- a tenth front panel indicator indicates a situation where said third and fourth control signals are inactive.

21. The matching and tuning network according to claim 5, wherein the coupling of the pair of mutually coupled coils is varied by moving the secondary winding relative to the primary winding which is fixed.

22. The matching and tuning network according to claim 1, wherein the voltage sensing means is located at the RF power source and the input current detector means and phase detector means are located in series in the primary circuit, between the source of RF power and the variable tuning capacitor.

23. The matching and tuning network according to claim 1, wherein the transformer has a plurality of fixed tapping positions, one of which may be selected to present a desired impedance value at the secondary winding of said mutually coupled coils.

24. The matching and tuning network according to claim 1, wherein the transformer further comprises a dc path to ground for the antenna.

25. The matching and tuning network according to claim 1 further comprising:
- a power detector means connected to said voltage detector means and said input current detector means;
- a selector switch connected to said power detector means, said antenna current detector means, and a front panel meter;
- wherein said power detector means output a forward power value and a reflected power value to said selector switch and said antenna current means outputs an antenna current value to said selector switch;
- and wherein said selector switch may be positioned in one of a plurality of positions; one of said plurality of positions resulting in the display of said forward power value on said front panel meter, another of said plurality of positions resulting in the display of said reflected power value on said front panel meter, another of said plurality of positions resulting in the display of said antenna current value on said front panel meter and yet another of said plurality of positions resulting in the display of said antenna current value on said front panel meter on a second, linear scale.

26. The matching and tuning network according to claim 1, wherein said variable tuning capacitor comprises an array of six fixed high power capacitors which are selectively connected in parallel to resonate the inductance of the primary winding of said pair of mutually coupled coils.

* * * * *